US012588250B2

(12) United States Patent
Radu et al.

(10) Patent No.: US 12,588,250 B2
(45) Date of Patent: Mar. 24, 2026

(54) NCFET TRANSISTOR COMPRISING A SEMICONDUCTOR-ON-INSULATOR SUBSTRATE

(71) Applicant: Soitec, Bernin (FR)

(72) Inventors: Ionut Radu, Bernin (FR); Guillaume Besnard, Bernin (FR); Sorin Cristoloveanu, Bernin (FR)

(73) Assignee: Soitec, Bernin (FR)

( * ) Notice: Subject to any disclaimer, the term of this patent is extended or adjusted under 35 U.S.C. 154(b) by 428 days.

(21) Appl. No.: 18/551,104

(22) PCT Filed: Mar. 17, 2022

(86) PCT No.: PCT/FR2022/050479
§ 371 (c)(1),
(2) Date: Sep. 18, 2023

(87) PCT Pub. No.: WO2022/195226
PCT Pub. Date: Sep. 22, 2022

(65) Prior Publication Data
US 2024/0170577 A1      May 23, 2024

(30) Foreign Application Priority Data
Mar. 18, 2021      (FR) ....................................... 2102738

(51) Int. Cl.
*H10D 30/67*          (2025.01)
*H01L 21/762*         (2006.01)

(52) U.S. Cl.
CPC ... *H10D 30/6758* (2025.01); *H01L 21/76254* (2013.01)

(58) Field of Classification Search
CPC ........... H10D 30/6758; H10D 30/0323; H10D 30/6744; H10D 86/201; H10D 10/86215; H10D 87/00; H01L 21/76254
See application file for complete search history.

(56) References Cited

U.S. PATENT DOCUMENTS 10,121,846 B1      11/2018   Zaka et al.
12,040,399 B2 *    7/2024    Tsukuda ............... H10D 64/015
(Continued)

FOREIGN PATENT DOCUMENTS

CN          102194827 A      9/2011
EP            1811560 A1      7/2007
(Continued)

OTHER PUBLICATIONS

Wei Guo , Agham B. Posadas , Alexander A. Demkov "Epitaxial integration of BaTiO3 on Si for electro-optic applications, Department of Physics, The University of Texas at Austin", Austin, Texas 78712 J. Vac. Sci. Technol. A 39, 030804 (2021) (Year: 2021).*
(Continued)

*Primary Examiner* — Matthew L Reames
(74) *Attorney, Agent, or Firm* — TraskBritt

(57)                ABSTRACT

An NCFET transistor comprises a semiconductor-on-insulator substrate for a field-effect transistor, and the NCFET transistor successively comprises, from its base to its surface: a semiconductor carrier substrate; a single ferroelectric layer, arranged in direct contact with the carrier substrate, which layer is designed to be biased so as to form a negative capacitance; and an active layer of a semiconductor material, which layer is designed to form the channel of the transistor, and is arranged in direct contact with the ferroelectric layer. The NCFET transistor further comprises a channel that is arranged in the active layer, a source and a drain that are arranged in the active layer on either side of the channel, and a gate that is arranged on the channel and is insulated from the channel by a gate dielectric.

20 Claims, 5 Drawing Sheets

(56) References Cited

U.S. PATENT DOCUMENTS

| | | |
|---|---|---|
| 2007/0054466 A1 | 3/2007 | Hebras |
| 2007/0173033 A1 | 7/2007 | Allibert et al. |
| 2010/0044830 A1 | 2/2010 | Cayrefourcq |
| 2011/0012200 A1 | 1/2011 | Allibert et al. |
| 2020/0066867 A1 | 2/2020 | Cheng et al. |
| 2024/0136437 A1* | 4/2024 | Salahuddin ........ H10D 30/6757 |

FOREIGN PATENT DOCUMENTS

| | | |
|---|---|---|
| JP | 2007-201430 A | 8/2007 |
| JP | 2009-508329 A | 2/2009 |
| JP | 2011-517061 A | 5/2011 |
| KR | 10-2007-0077439 A | 7/2007 |

OTHER PUBLICATIONS

Haeni, J., Irvin, P., Chang, W. et al. Room-temperature ferroelectricity in strained SrTiO3. Nature 430, 758-761 (2004). https://doi.org/10.1038/nature02773 (Year: 2004).*

Hu et al., Negative capacitance enables FinFET and FDSOI scaling to 2 nm node, 2017 IEEE International Electron Devices Meeting (IEDM), (Dec. 2017).

International Search Report for Application No. PCT/FR2022/050479 dated Jun. 10, 2022, 4 pages.

International Written Opinion for Application No. PCT/FR2022/050479 dated Jun. 10, 2022, 11 pages.

Popov et al., Ferroelectric Properties of SOS and SOI pseudo-MOSFETs with Hf02interlayers, Solid State Electronics, vol. 159, (Mar. 19, 2019), pp. 63-70.

Popov et al., Ferroelectric Properties of SOS and SOI Pseudo-MOSFETs with HfO2 Interlayers, Solid State Electronics, vol. 159, (2019), pp. 63-70.

Japanese Notice of Reasons for Rejection for Application No. 2023-546294 dated Nov.18, 2025, 10 pages with English translation.

Korean Office Action for Application No. 10-2023-7035421 dated Sep. 15, 2025, 20 pages with machine translation.

* cited by examiner

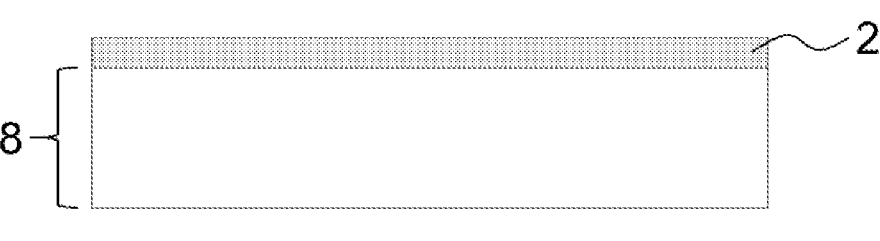
FIGURE 5A
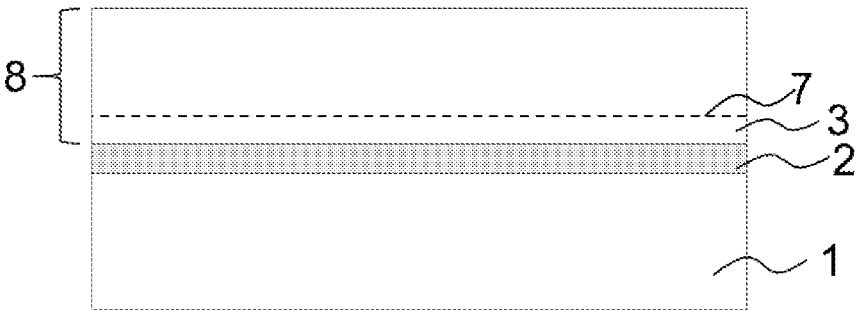
FIGURE 5B
FIGURE 5C
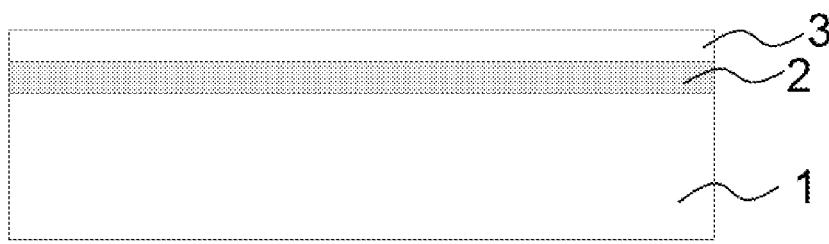
FIGURE 5D

NCFET TRANSISTOR COMPRISING A SEMICONDUCTOR-ON-INSULATOR SUBSTRATE

CROSS-REFERENCE TO RELATED APPLICATIONS

This application is a national phase entry under 35 U.S.C. § 371 of International Patent Application PCT/FR2022/050479, filed Mar. 17, 2022, designating the United States of America and published as International Patent Publication WO2022/195226 A1 on Sep. 22, 2022, which claims the benefit under Article 8 of the Patent Cooperation Treaty to French Patent Application Serial No. FR2102738, filed Mar. 18, 2021.

TECHNICAL FIELD

The present disclosure relates to a negative-capacitance field-effect transistor (NCFET) comprising a semiconductor-on-insulator substrate.

BACKGROUND

Semiconductor-on-insulator substrates, in particular, fully depleted ones, known by the acronym FDSOI from the term "Fully Depleted Silicon On Insulator," are commonly used in the field of microelectronics, in particular, for fabricating transistors.

An FDSOI substrate comprises, in succession, a support substrate, a buried oxide layer (often denoted using the acronym BOX, for "Buried OXide") and an ultra-thin layer of monocrystalline silicon, which is the active layer, that is to say the layer in or on which electronic components are intended to be formed. Ultra-thin in the present text should be understood to mean that the thickness of the silicon layer is less than or equal to 20 nm. The great thinness of the active layer and, where applicable, of the oxide layer allow the active layer of a transistor formed from this substrate to be fully depleted.

In a transistor formed from an FDSOI substrate, the threshold voltage (VT), that is to say, the minimum voltage to be applied to the front gate and the source to put the transistor into the on state, may be controlled by applying a bias voltage (Vbb, "back bias voltage") to a back gate.

A negative-capacitance field-effect transistor (NCFET) may be obtained by introducing a ferroelectric layer into the gate dielectric (Hu et al., Negative Capacitance Enables FinFET and FDSOI Scaling to 2 nm Node, 2017 IEEE International Electron Devices Meeting (IEDM)).

FIG. 1 illustrates such a transistor.

The NCFET transistor comprises, in succession from its base (or back face) to its surface (or front face), a substrate 1, a dielectric layer (BOX) 4 and an active layer 3a, a region 3b of which forms the channel 3b of the transistor. The channel 3b is covered by a gate insulation layer 30, on which a ferroelectric layer 5 is arranged. The electrode 20 of the gate 10 is arranged above the ferroelectric layer 2.

The electrodes 21 and 22 of the source 11 and of the drain 12 are arranged on the two respective sides of the stack comprising the gate 10.

Document US 2020/0066867 proposes to add a ferroelectric layer in an FDSOI substrate by inserting the ferroelectric layer and a layer of polycrystalline silicon between the support substrate and the buried oxide layer. The ferroelectric layer gives the back of the buried oxide layer a negative capacitance that is intended to apply a reverse bias suitable for modulating the switching voltage of the transistor. However, this substrate is complex and the process for fabricating the transistor is complicated and expensive.

BRIEF SUMMARY

One aim of the present disclosure is to design an NCFET transistor that allows better control of the electric current in the active layer, faster switching of the transistor, and improved coupling with the back gate, while at the same time having a simple structure capable of fabrication using existing processes.

To this end, the present disclosure proposes an NCFET transistor comprising a semiconductor-on-insulator substrate for a fast-switching field-effect transistor, including, in succession from its base to its surface:

a semiconductor support substrate, a single ferroelectric layer, arranged in direct contact with the support substrate, and an active layer of a semiconductor material, suitable for forming the channel of the transistor, arranged in direct contact with the ferroelectric layer, the NCFET transistor furthermore comprising a channel arranged in the active layer, a source and a drain that are arranged in the active layer on either side of the channel, and a gate arranged on the channel, insulated from the channel by a gate dielectric.

"In succession from its base to its surface" should be understood to mean a stack of the layers in a direction perpendicular to the main surface of the support substrate, in the direction from the support substrate to the active layer.

"Direct contact" between two layers should be understood to mean direct contact over the extent of the interface between the layers in question.

The proposed architecture makes it possible to integrate the following in the ferroelectric layer, which forms the electrically insulating layer of the semiconductor-on-insulator substrate:

electrical insulation properties, making it possible to obtain a transistor with a fully depleted active layer, and the ability to form a negative capacitance under the active layer, making it possible to control the threshold voltage of the transistor through the polarization of the ferroelectric layer.

The ferroelectric layer has a thickness of between 1 and 30 nm, and more advantageously of between 1 and 10 nm.

The ferroelectric layer has a relative dielectric permittivity greater than 10 and, particularly advantageously, a relative dielectric permittivity greater than 20. In some embodiments, the ferroelectric layer comprises hafnium oxide, zirconium oxide, yttrium oxide, lanthanum oxide, hafnium aluminate or an alloy comprising one or more of these materials.

The active layer has a thickness of between 1 nm and 100 nm. In some embodiments, the active layer comprises silicon, germanium, a silicon-germanium alloy, gallium arsenide, indium phosphide, gallium-indium arsenide, graphene or tungsten disulfide.

The present disclosure also relates to a process for fabricating a negative-capacitance field-effect transistor, the process being primarily characterized in that it comprises the following steps:

providing a semiconductor support substrate, providing a semiconductor donor substrate, forming at least one ferroelectric layer on a surface of the support substrate and/or of the donor substrate, forming a weakened zone in the donor substrate, so as to delimit a semiconductor layer to be transferred, bonding the donor substrate to the support substrate, each ferroelectric layer being arranged at the bonding interface, detaching the donor substrate along the weakened zone, so as to transfer the semiconductor layer onto the support substrate, the semiconductor layer forming the active layer of the transistor, forming a channel in the active layer, forming a source and a drain in the active layer on either side of the channel, depositing a gate dielectric on the channel and forming a gate on the channel, the gate being electrically insulated from the channel by the gate dielectric.

In some embodiments, the at least one ferroelectric layer is formed by thin atomic layer deposition or by pulsed laser ablation.

Preferably, the process comprises heat-treating the at least one ferroelectric layer before bonding. Advantageously, the heat treatment is carried out at a temperature of between 500° C. and 1000° C. Advantageously, the heat treatment is carried out for a duration less than two hours.

In some embodiments, forming the weakened zone comprises implanting hydrogen and/or helium atoms into the donor substrate.

In some embodiments, the process comprises, before bonding, one or more surface treatments on the at least one ferroelectric layer, the treatments comprising cleaning, plasma treatment and/or chemical-mechanical polishing.

Advantageously, the process comprises, after the transfer step, annealing at a temperature less than or equal to 1000° C.

BRIEF DESCRIPTION OF THE FIGURES

Other features and advantages of the present disclosure will become apparent from the following detailed description, with reference to the accompanying drawings, in which:

FIGS. 5A-5D illustrate steps of fabricating an NCFET transistor from a semiconductor-on-insulator substrate, in which a ferroelectric layer is deposited on a donor substrate and the ferroelectric layer and a semiconductor layer are transferred onto a support substrate according to a second embodiment of the present disclosure.

DETAILED DESCRIPTION OF EMBODIMENTS

Figure 1:
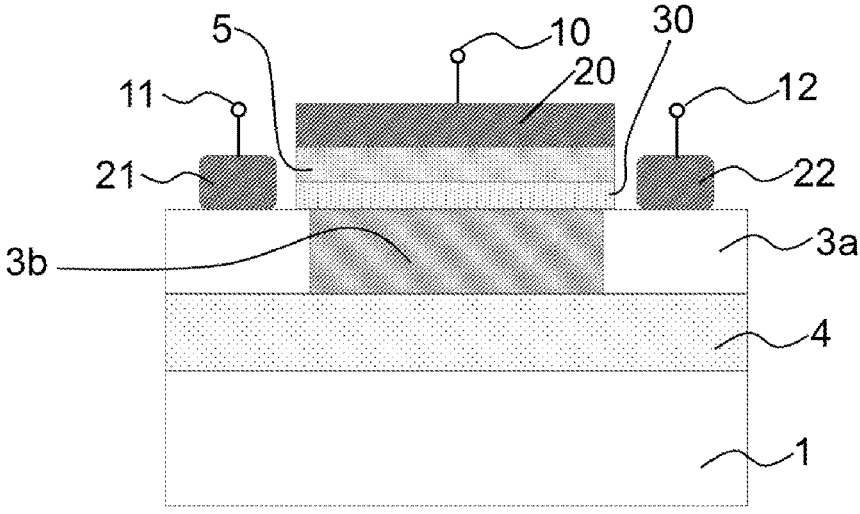
FIG. 1 is a schematic sectional view of an NCFET transistor of known type.
Figure 2:
FIG. 2 illustrates a semiconductor-on-insulator substrate according to one embodiment of the present disclosure.

FIG. 2 illustrates one embodiment of an FDSOI substrate for an NCFET transistor according to the present disclosure.

The FDSOI substrate comprises a support substrate 1 made of a semiconductor material, a ferroelectric layer 2 arranged on the support substrate, and an active layer 3 arranged on the ferroelectric layer. "On" denotes a relative position of the layers considering the layers from the base of the support substrate to the surface on the side of the active layer. The layers are arranged in direct contact over the extent of their interfaces.

Preferably, the support substrate is monocrystalline. In other embodiments, the support substrate may be polycrystalline, provided that it is compatible with the processes implemented on semiconductor substrate fabrication lines, in particular, in terms of geometry of the support substrate and absence of contaminants.

Advantageously, the support substrate may be made of silicon, but other semiconductor materials may be used.

The ferroelectric layer has a relative dielectric permittivity greater than 10, preferably greater than 20.

In some embodiments, the ferroelectric layer may be a layer of hafnium oxide, zirconium oxide, yttrium oxide, lanthanum oxide, hafnium aluminate or an alloy comprising one or more of these materials.

The ferroelectric layer has a thickness of between 1 and 30 nm, and more advantageously of between 1 and 10 nm.

The active layer is a monocrystalline semiconductor layer, suitable for forming a channel in a reverse-biased transistor.

The active layer is preferably a layer made of silicon, of germanium, of a silicon-germanium alloy, of gallium arsenide, of indium phosphide, of gallium-indium arsenide, of graphene or of tungsten disulfide.

The active layer typically has a thickness of between 1 nm and 100 nm.

The ferroelectric layer, which has dielectric properties, therefore replaces the BOX layer in the FDSOI substrate.

The ferroelectric layer thus makes it possible to delimit the channel of a transistor formed from the active layer of this substrate such that it is fully depleted.

The ferroelectric layer moreover simultaneously makes it possible to use the ferroelectric polarization effect in order to control the active layer very quickly.

In other words, the ferroelectric layer combines two functions: electrical insulation of the active layer from the support substrate and ferroelectric polarization at the back of the active layer.

Such a substrate may advantageously be used for application to a negative-capacitance field-effect transistor (NCFET) or any other super-fast switching device with an improvement in the on-off current ratio ("Ion/Ioff ratio") (that is to say, a ratio greater than $10^5$), for example, a tunnel field-effect transistor or a ferroelectric field-effect transistor.

Figure 3:
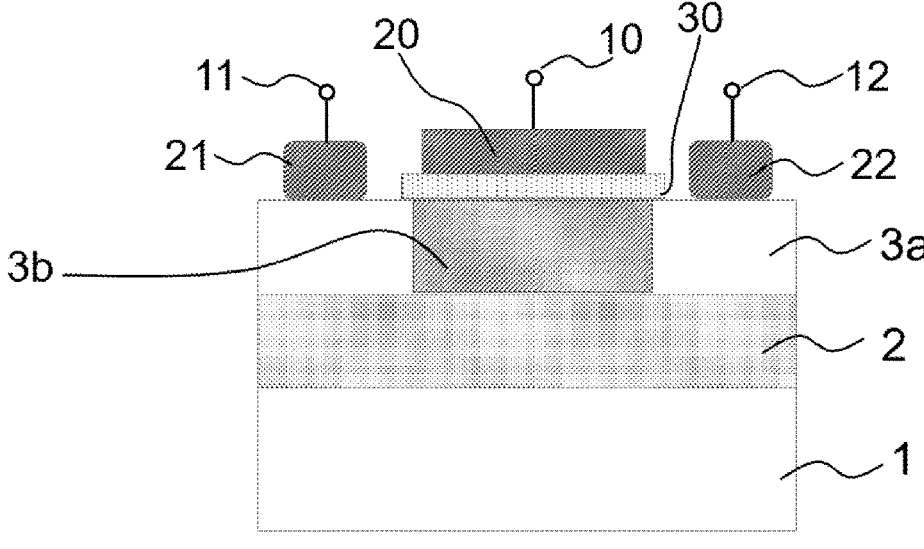
FIG. 3 is a schematic sectional view of a negative-capacitance field-effect transistor according to the present disclosure.

FIG. 3 is a schematic sectional view of a negative-capacitance field-effect transistor based on an FDSOI substrate comprising a buried ferroelectric layer according to the present disclosure.

The transistor comprises, in succession from its base (or back face) to its surface (or front face), a support substrate 1, a ferroelectric layer 2 and an active layer 3a, a region of which forms the channel 3b of the transistor. The channel 3b is covered by a gate insulation layer 30 on which the gate electrode 20 of the gate 10 is arranged.

The electrodes 21 and 22 of the source 11 and of the drain 12 are arranged on the two respective sides of the stack comprising the gate 10.

The transistor comprises a back gate (not shown) for modulating the threshold voltage. The back gate may be placed at a distance from the stack or be integrated into the support substrate.

In an electron-channel transistor, a negative bias voltage Vbb is applied to the back gate in order to increase the threshold voltage and reduce the leakage current, thereby minimizing power consumption during the off (or passive) state of the transistor. In the on state, a positive voltage Vbb is applied, which lowers the threshold voltage and increases the current flow.

A positive voltage Vbb results in the ferroelectric layer being polarized, such that positive charges are located on the upper surface of the ferroelectric layer, in contact with the channel, and greatly reduce the threshold voltage. Conversely, a negative voltage Vbb switches the polarization of the ferroelectric layer so as to obtain negative charges at the interface between the ferroelectric layer and the channel of the transistor, thereby substantially increasing the threshold voltage. The ferroelectric layer thus makes it possible to amplify the effect of the voltage Vbb.

When the bias voltage Vbb applied to the back gate of the NCFET changes from a negative value to a positive value, the ferroelectric layer changes polarization abruptly. Therefore, the threshold voltage increases abruptly from a high value to a low value, and the slope below the threshold is therefore steep. The steeper the slope below the threshold, the faster the switching between the ON and OFF states.

Conversely, in a hole-channel transistor, a positive voltage Vbb is applied to the back gate during the off state of the transistor, and a negative voltage Vbb is applied in the on state.

The on-off current ratio of the transistor is proportional to the switching speed. In an NCFET, this ratio may reach values greater than $10^5$.

NCFET transistors are of particular interest for very large-scale integration (VLSI) applications, such as, for example, high-performance ultra-low-power microprocessors. [Hu et al.]

The voltage Vbb on the back gate has an effect on the threshold voltage VT via a capacitive divider comprising the capacitance of the gate insulation layer, the capacitance of the depleted active layer and the capacitance of the BOX. In the case of a known NCFET transistor, the BOX layer absorbs a large part of the voltage Vbb. Only a small fraction of the voltage Vbb (approximately equal to the ratio between the thicknesses of the gate insulation layer and of the BOX) is therefore used to modulate the threshold voltage. In an NCFET transistor according to the present disclosure, the fact that the substrate comprises a single ferroelectric dielectric layer makes it possible to greatly reduce the voltage absorbed by the dielectric layer compared to a known NCFET transistor.

A description will now be given of the various steps of the process for producing an FDSOI substrate, making it possible to form an NCFET transistor according to the present disclosure using a SmartCut™ layer transfer process.

Steps of a first embodiment are illustrated in FIGS. 4A-4D.

The starting point is a semiconductor support substrate 1 and a semiconductor donor substrate 8. The donor substrate may comprise silicon, germanium, a silicon-germanium alloy, gallium arsenide, indium phosphide, gallium-indium arsenide, graphene or tungsten disulfide. The donor substrate may be a solid substrate consisting of one of the materials belonging to the above list, or comprise a stack of at least two different materials, at least one of which forms part of the above list, a layer to be transferred having to be formed from the material.

Figure 4A:
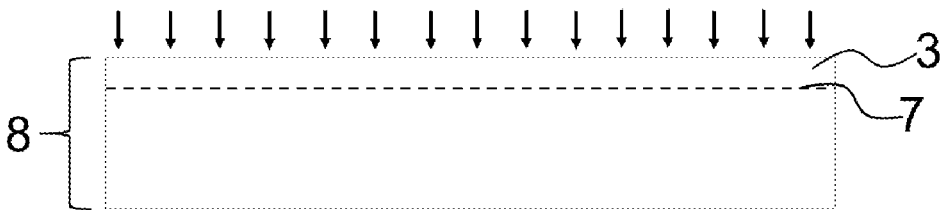
FIGS. 4A-4D illustrate steps of fabricating an NCFET transistor from a semiconductor-on-insulator substrate, in which a semiconductor layer is transferred onto a support substrate comprising a ferroelectric layer according to one embodiment of the present disclosure.

With reference to FIG. 4A, a weakened zone 7 is formed in the donor substrate 8, so as to delimit a semiconductor layer 3. The weakened zone 7 is formed in the donor substrate 8 at a predetermined depth that corresponds substantially to the thickness of the semiconductor layer 3 that is intended to form the channel. The semiconductor layer 3 typically has a thickness of between 1 nm and 100 nm. Preferably, the weakened zone 7 is created by implanting hydrogen and/or helium atoms into the donor substrate.

The surface of the donor substrate may be given an optional treatment. This treatment may comprise, by way of illustrative and non-limiting example, chemical cleaning or plasma activation.

Figure 4B:
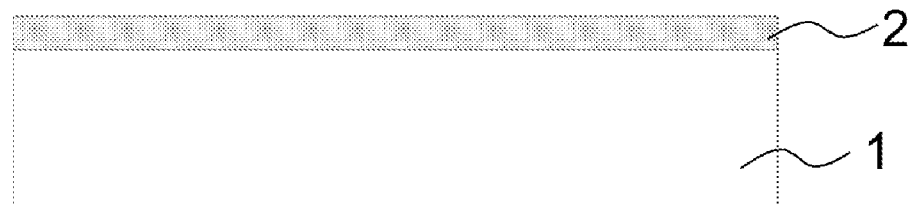

With reference to FIG. 4B, a ferroelectric layer 2 is deposited on the surface of the support substrate 1. The ferroelectric layer 2 has a relative dielectric permittivity greater than 10, preferably greater than 20, and a thickness of between 1 and 30 nm, and more advantageously of between 1 and 10 nm. The deposition techniques may comprise, by way of illustrative and non-limiting example, atomic thin layer deposition (ALD, acronym for the term "Atomic Layer Deposition") or pulsed laser ablation (PLD, acronym for the term "Pulsed Laser Deposition") techniques.

It may be useful or necessary to apply a heat treatment after deposition of the ferroelectric layer 2 in order to eliminate volatile products emitted by the layer and liable to interfere with the bonding on the donor substrate. The heat treatment is advantageously carried out at a temperature of between 500° C. and 1000° C. and advantageously for a duration less than two hours.

A surface treatment of the ferroelectric layer is then carried out to prepare the surface for bonding through molecular adhesion. This treatment may comprise, without limitation, one or more steps of cleaning and/or plasma treatment and/or chemical-mechanical polishing.

Figure 4C:
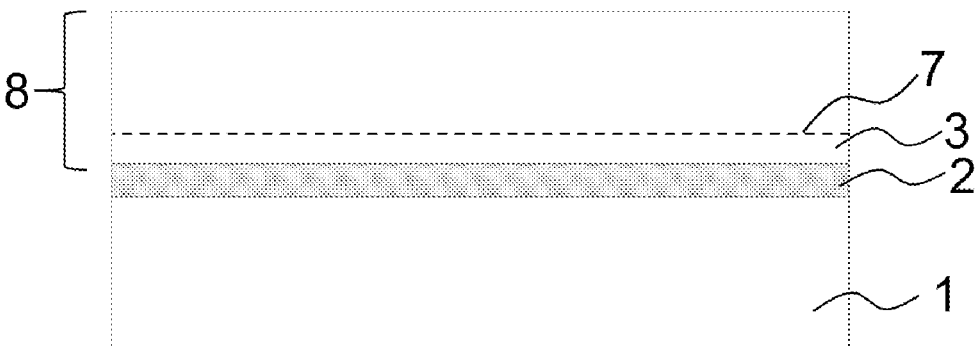

With reference to FIG. 4C, the donor substrate 8 is then bonded to the support substrate 1. The ferroelectric layer 2 is thus arranged at the bonding interface between the support substrate 1 and the donor substrate 8.

Figure 4D:
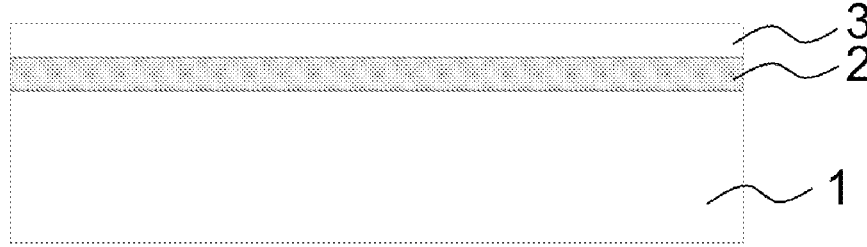

With reference to FIG. 4D, detachment of the donor substrate is brought about along the weakened zone, so as to transfer the semiconductor layer 3 onto the support substrate 1 comprising the ferroelectric layer 2.

FIGS. 5A-5D illustrate steps of a second embodiment of the process for fabricating the FDSOI substrate.

The starting point is a donor substrate 8 and a support substrate 1 that are similar to those described for the first embodiment.

A ferroelectric layer 2 is deposited on the donor substrate 8, as illustrated in FIG. 5A. The deposition techniques may comprise, by way of illustrative and non-limiting example, atomic thin layer deposition (ALD) or pulsed laser ablation (PLD) techniques.

The ferroelectric layer 2 has a relative dielectric permittivity greater than 10, preferably greater than 20, and a thickness of between 1 and 30 nm, and more advantageously of between 1 and 10 nm.

It may be useful or necessary to apply a heat treatment after deposition of the ferroelectric layer 2 in order to eliminate volatile products that might interfere with the bonding on the substrate. The heat treatment is advantageously carried out at a temperature of between 500° C. and 1000° C. and advantageously for a duration less than two hours.

With reference to FIG. 5B, a weakened zone 7 is then formed in the donor substrate 8, so as to delimit a semiconductor layer 3 covered by the ferroelectric layer 2. The semiconductor layer 3 has a thickness of between 1 nm and 100 nm. The weakened zone 7 is formed in the donor substrate 8 at a depth that corresponds to the thickness of the semiconductor layer 3 plus the thickness of the ferroelectric layer 2. Preferably, the weakened zone 7 is created by implanting hydrogen and/or helium atoms into the donor substrate.

As an alternative, the weakened zone 7 may be formed in the donor substrate 8 before deposition of the ferroelectric layer 2. Next, the ferroelectric layer 2 is deposited. It may be useful or necessary to apply a heat treatment after deposition of the ferroelectric layer 2 in order to eliminate volatile products that might interfere with the bonding on the support substrate.

A surface treatment of the ferroelectric layer is then carried out to prepare the surface for bonding through molecular adhesion. This treatment may comprise, without limitation, one or more steps of cleaning and/or plasma treatment and/or chemical-mechanical polishing.

The surface of the support substrate may be given an optional treatment. This treatment may comprise, by way of illustrative and non-limiting example, chemical cleaning and/or plasma activation.

With reference to FIG. 5C, the donor substrate 8 is then bonded to the support substrate 1. The ferroelectric layer 2 is thus arranged at the bonding interface between the support substrate 1 and the donor substrate 8.

With reference to FIG. 5D, detachment of the donor substrate is brought about along the weakened zone, so as to transfer the semiconductor layer 3 and the ferroelectric layer 2 onto the support substrate 1.

FIGS. 6A-6E illustrate a third embodiment of the process for fabricating the FDSOI substrate.

Figure 6A:
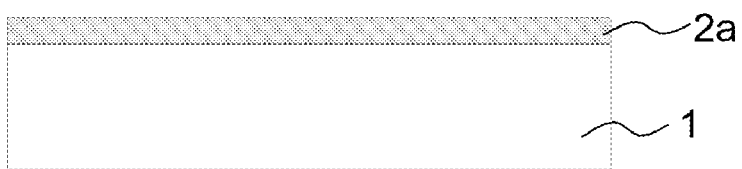
FIGS. 6A-6E illustrate steps of fabricating an NCFET transistor from a semiconductor-on-insulator substrate, in which a first ferroelectric layer is deposited on a donor substrate and the first ferroelectric layer and a semiconductor layer are transferred onto a support substrate comprising a second ferroelectric layer according to a third embodiment of the present disclosure.
Figure 6B:
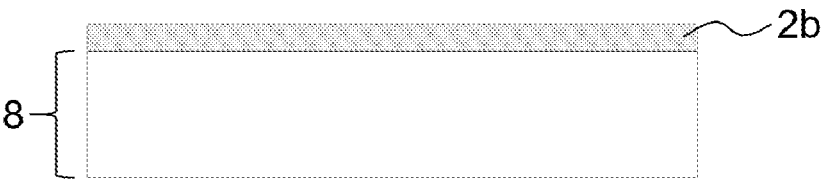

A first ferroelectric layer 2a is deposited on the support substrate 1, as illustrated in FIG. 6A. The first ferroelectric layer 2a has a relative dielectric permittivity greater than 10, preferably greater than 20, and a thickness of between 0.5 and 15 nm, and more advantageously of between 0.5 and 5 nm. A second ferroelectric layer 2b is deposited on the donor substrate 8, as illustrated in FIG. 6B. The second ferroelectric layer 2b has a relative dielectric permittivity greater than 10, preferably greater than 20, and a thickness of between 0.5 and 15 nm, and more advantageously of between 0.5 and 5 nm, the sum of the thicknesses of the first and second ferroelectric layers 2a, 2b advantageously being between 1 and 30 nm, preferably between 1 and 10 nm.

The deposition techniques may comprise, by way of illustrative and non-limiting example, atomic thin layer deposition (ALD) or pulsed laser ablation (PLD) techniques. The first ferroelectric layer 2a and the second ferroelectric layer 2b may be deposited using identical or different techniques.

A heat treatment may then be applied to each of the substrates. The heat treatment is advantageously carried out at a temperature of between 500° C. and 1000° C. and advantageously for a duration less than two hours. The heat treatments of the first ferroelectric layer 2a and of the second ferroelectric layer 2b may be identical or different.

Figure 6C:
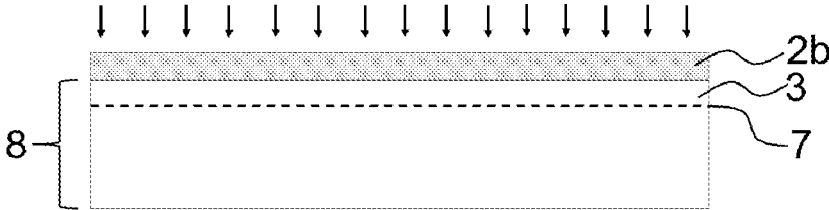

With reference to FIG. 6C, a weakened zone 7 is then formed in the donor substrate 8, so as to delimit a semiconductor layer 3 comprising the second ferroelectric layer 2b. The semiconductor layer 3 has a thickness of between 1 nm and 100 nm. The weakened zone 7 is formed in the donor substrate 8 at a depth that corresponds to the thickness of the semiconductor layer 3 plus the thickness of the ferroelectric layer 2. Preferably, the weakened zone 7 is created by implanting hydrogen and/or helium atoms into the donor substrate.

As an alternative, the weakened zone 7 may be formed in the donor substrate 8 before deposition of the second ferroelectric layer 2b. Next, the second ferroelectric layer 2b is deposited. It may be useful or necessary to apply a heat treatment after deposition of the second ferroelectric layer 2b in order to eliminate volatile products that might interfere with the bonding on the substrate.

After the deposition of the first and second ferroelectric layers 2a, 2b, a surface treatment may be applied to each of the substrates.

The surface treatment may comprise, without limitation, one or more steps of cleaning and/or plasma treatment and/or chemical-mechanical polishing.

The treatments may be identical or different for the first ferroelectric layer 2a and for the second ferroelectric layer 2b.

Figure 6D:
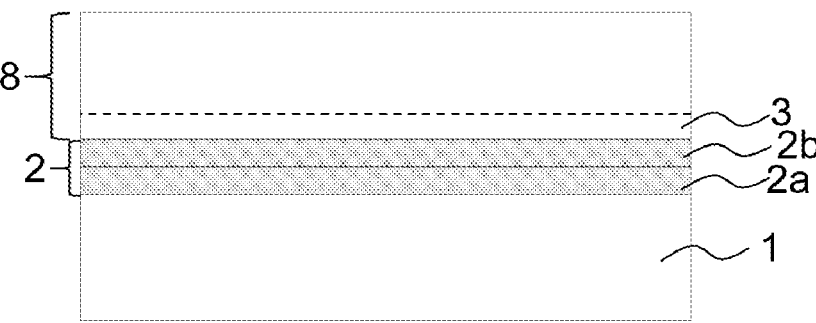

With reference to FIG. 6D, the donor substrate 8 comprising the second ferroelectric layer 2b is then bonded to the support substrate 1 comprising the first ferroelectric layer 2a. The first and second ferroelectric layers 2a and 2b are thus stacked, together forming a ferroelectric layer 2 at the bonding interface between the support substrate 1 and the donor substrate 8.

Figure 6E:

With reference to FIG. 6E, detachment of the donor substrate is brought about along the weakened zone, so as to transfer the semiconductor layer 3 and the second ferroelectric layer 2b onto the support substrate 1 comprising the first ferroelectric layer 2a.

However, the layer transfer process is not limited to the SmartCut™ process; it may thus consist, for example, in bonding the donor substrate to the support substrate by way of the one or more ferroelectric layers and then in thinning the donor substrate via its face opposite the support substrate until the desired thickness for the semiconductor layer is obtained. In this case, it is not necessary to form a weakened zone in the donor substrate.

After the layer transfer, one or more steps of annealing the FDSOI substrate may be carried out at temperatures preferably less than or equal to 1000° C.

This annealing has the effect of stabilizing the adhesion between the ferroelectric layer and the transferred semiconductor layer, along with the characteristics of the ferroelectric material, such as its dielectric constant.

The annealing may be carried out in a single step, for example, a gradual rise in temperature between 200° C. up to 1000° C., then a plateau at 1000° C. for a duration of 1-2 hours, followed by a drop back to room temperature, this example being given purely for illustration and not being limiting.

As an alternative and more advantageously, the annealing comprises multiple separate steps. By way of purely illustrative and non-limiting example, initial annealing is carried out at 500° C.-800° C. in an oven with a plateau of 2-5 hours at 800° C. This step is followed by rapid thermal annealing (RTA) at 1000° C. for a duration of between 30 seconds and a few minutes.

In addition, after the transfer, it is possible to carry out a finishing treatment on the surface of the semiconductor layer, so as to cure defects linked to the implantation and/or to reduce roughness.

It is then possible to form an NCFET transistor from the substrate produced according to the steps described above. With reference to FIG. 3, a gate dielectric layer 30 is deposited on a zone of the active layer 3a that is intended to form the channel 3b of the transistor. The thickness and the material of the dielectric layer are chosen so as to satisfy the electrical conditions pre-established in the specifications of the transistor, for example, the value of the dielectric capacitance and the minimum thickness from which tunnel currents are produced. By way of illustration and without limitation, such a layer may be formed from silicon oxide or another oxide having good electrical insulation.

A gate electrode 20 made of electrically conductive material is then formed on the gate dielectric layer 30. A source electrode 21 and a drain electrode 22 made of electrically conductive material are formed directly on the active layer 3a, such that the gate dielectric layer is arranged between the source electrode 21 and the drain electrode 22. Typically, the source, channel and drain regions are formed by a step of doping the active layer in the zones intended to form the respective electrodes. The source electrode and the drain electrode may be formed before or after the deposition of the dielectric and of the gate electrode.

A plurality of transistors may be produced by depositing a plurality of dielectric layers and a plurality of drain, source and gate electrodes on a single substrate having dimensions greater than an NCFET transistor to be formed. The substrate is then cut in order to separate the individual NCFET transistors.

The invention claimed is:

1. A negative-capacitance field-effect transistor (NCFET) comprising a semiconductor-on-insulator substrate for a field-effect transistor, comprising, in succession from a base of the NCFET to a surface of the NCFET:
   a semiconductor support substrate;
   a single ferroelectric layer, in direct contact with the support substrate, capable of being polarized so as to form a negative capacitance; and
   an active layer of a semiconductor material, capable of forming a channel of the NCFET, in direct contact with the ferroelectric layer;
   a channel in the active layer;
   a source and a drain in the active layer on either side of the channel;
   a gate dielectric; and
   a gate on the gate dielectric adjacent the channel, the gate insulated from the channel by the gate dielectric.

2. The NCFET of claim 1, wherein the ferroelectric layer has a thickness of between 1 and 30 nm.

3. The NCFET of claim 1, wherein the ferroelectric layer has a relative dielectric permittivity greater than 10.

4. The NCFET of claim 1, wherein the ferroelectric layer comprises hafnium oxide, zirconium oxide, yttrium oxide, lanthanum oxide, hafnium aluminate or an alloy comprising one or more of these materials.

5. The NCFET of claim 1, wherein the active layer has a thickness of between 1 nm and 100 nm.

6. The NCFET of claim 1, wherein the active layer comprises silicon, germanium, a silicon-germanium alloy, gallium arsenide, indium phosphide, gallium-indium arsenide, graphene or tungsten disulfide.

7. A method of fabricating a negative-capacitance field-effect transistor (NCFET), the method comprising:
   providing a semiconductor support, substrate;
   providing a semiconductor donor, substrate;
   forming at least one ferroelectric layer on a surface of the support substrate and/or a surface of the donor substrate;

forming a weakened zone in the donor substrate, so as to delimit a semiconductor layer to be transferred;
   bonding the donor substrate to the support substrate, each ferroelectric layer being disposed at a bonding interface between the donor substrate and the support substrate;
   detaching the donor substrate along the weakened zone, so as to transfer the semiconductor layer onto the support substrate, the semiconductor layer forming an active layer of the field-effect transistor;
   forming the channel in the active layer;
   forming a source and a drain in the active layer on either side of the channel; and
   depositing a gate dielectric on the channel; and
   forming a gate on the channel, the gate being electrically insulated from the channel by the gate dielectric.

8. The method of claim 7, further comprising forming the at least one ferroelectric layer by thin atomic layer deposition or by pulsed laser ablation.

9. The method of claim 7, further comprising heat-treating the at least one ferroelectric layer before the bonding of the donor substrate to the support substrate.

10. The method of claim 9, wherein the heat-treating of the at least one ferroelectric layer comprises heat-treating the at least one ferroelectric layer at a temperature of between 500° C. and 1000° C.

11. The method of claim 9, wherein the heat-treating of the at least one ferroelectric layer comprises performing the heat-treating for a duration less than two hours.

12. The method of claim 7, wherein forming the weakened zone comprises implanting hydrogen and/or helium atoms into the donor substrate.

13. The method of claim 7, further comprising, before the bonding of the donor substrate to the support substrate, performing one or more surface treatments on the at least one ferroelectric layer, the one or more surface treatments comprising cleaning, plasma treatment and/or chemical-mechanical polishing.

14. The method of claim 7, further comprising, after the detaching of the donor substrate along the weakened zone, annealing the support substrate with the at least one ferroelectric layer and the semiconductor layer thereon, at a temperature less than or equal to 1000° C.

15. The NCFET of claim 2, wherein the ferroelectric layer has a thickness of between 1 and 10 nm.

16. The NCFET of claim 3, wherein the ferroelectric layer has a relative dielectric permittivity greater than 20.

17. The NCFET of claim 2, wherein the ferroelectric layer has a relative dielectric permittivity greater than 10.

18. The NCFET of claim 17, wherein the ferroelectric layer comprises hafnium oxide, zirconium oxide, yttrium oxide, lanthanum oxide, hafnium aluminate or an alloy comprising one or more of these materials.

19. The NCFET of claim 18, wherein the active layer has a thickness of between 1 nm and 100 nm.

20. The NCFET of claim 19, wherein the active layer comprises silicon, germanium, a silicon-germanium alloy, gallium arsenide, indium phosphide, gallium-indium arsenide, graphene or tungsten disulfide.

* * * * *